United States Patent [19]
Cho

[11] Patent Number: 6,056,544
[45] Date of Patent: May 2, 2000

[54] APPARATUS FOR BAKING RESISTS ON SEMICONDUCTOR WAFERS

[75] Inventor: Jun-Geol Cho, Seoul, Rep. of Korea

[73] Assignee: Samsung Electronics Co., Ltd., Suwon, Rep. of Korea

[21] Appl. No.: 09/301,327

[22] Filed: Apr. 29, 1999

[30] Foreign Application Priority Data

May 2, 1998 [KR] Rep. of Korea ................ 98-15840

[51] Int. Cl.[7] ..................................... F27D 7/06
[52] U.S. Cl. ................... 432/249; 392/416; 392/418
[58] Field of Search ..................... 432/5, 87, 122, 432/131, 141, 142, 247, 249; 392/416, 418; 438/660, 663, 715; 219/209

[56] References Cited

U.S. PATENT DOCUMENTS

| | | | |
|---|---|---|---|
| 4,518,848 | 5/1985 | Weber | 219/388 |
| 5,277,579 | 1/1994 | Takanabe | 432/5 |
| 5,404,894 | 4/1995 | Shiraiwa | 432/239 |
| 5,414,244 | 5/1995 | Imahashi | 392/416 |
| 5,512,320 | 4/1996 | Turner et al. | 432/5 |
| 5,697,749 | 12/1997 | Iwabuchi et al. | 432/239 |

*Primary Examiner*—Denise L. Ferensic
*Assistant Examiner*—Gregory A. Wilson
*Attorney, Agent, or Firm*—Howrey &n Simon

[57] ABSTRACT

An apparatus for baking resists on semiconductor wafers, which is capable of preventing cold air from entering the interior of the baking chamber while a baking process is carried out, by controlling the temperature of ambient air surrounding the baking chamber to equal the internal temperature of the baking chamber. This control is achieved by providing a hot air supply unit and nozzles. The hot air supply unit generates hot air heated to a desired temperature and supplies the generated hot air to the nozzles. The nozzles are connected to the hot air supply unit and arranged near the baking chamber. The nozzles inject the hot air onto the outer surface of the baking chamber. The nozzles may be arranged around the entrance of the baking chamber where a wafer to be baked is loaded. In this case, the nozzles inject heated air onto opposite surfaces of the wafer being loaded or unloaded. The baking apparatus may have a configuration including a cooling chamber, a feeding chamber and a baking chamber. In this case, the baking apparatus carries out a baking process in a sealed condition.

13 Claims, 8 Drawing Sheets

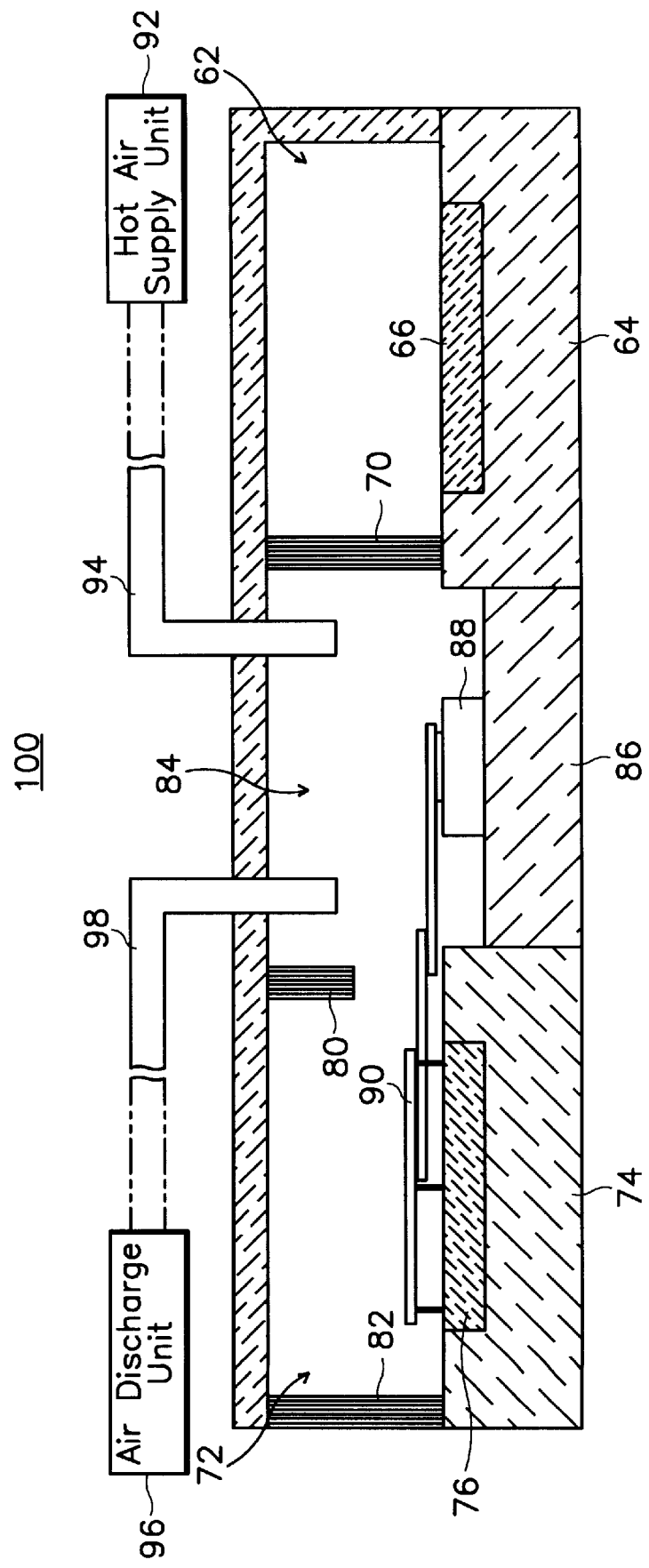

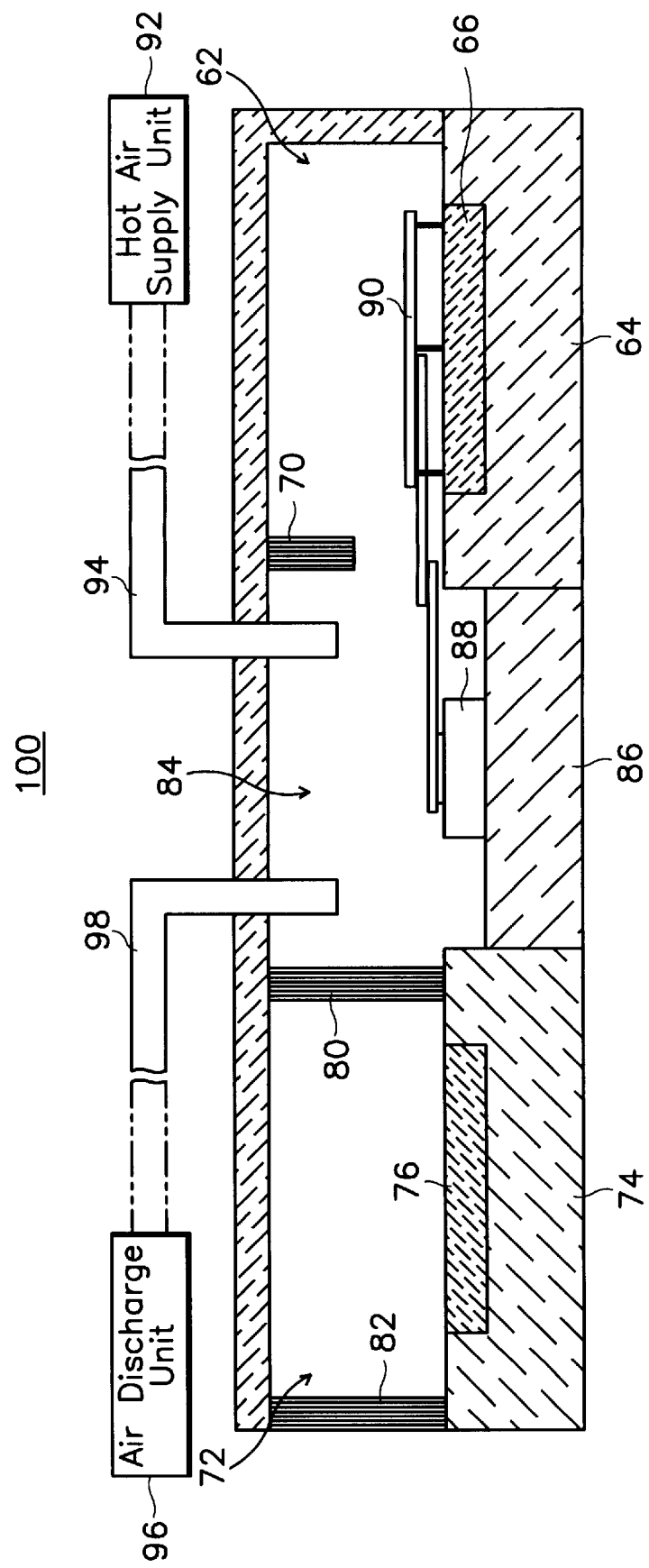

APPARATUS FOR BAKING RESISTS ON SEMICONDUCTOR WAFERS

FIELD OF THE INVENTION

The present invention relates to an apparatus for fabricating semiconductor devices, and more particularly to an apparatus for baking pattern-forming photoresists on semiconductor wafers.

BACKGROUND OF THE INVENTION

Recently, developments in semiconductor technology have been concentrated on the fabrication of highly integrated semiconductor devices. In the fabrication of such highly integrated semiconductor devices, it is important to use a photolithography method with a high precision. Furthermore, a linewidth of 0.25 $\mu$m or less is required to achieve a high integration of semiconductor devices. However, it is impossible to obtain such a micro linewidth using existing photolithography methods. Currently, such a micro linewidth is obtained via a lithography method like a deep ultraviolet (DUV) process. Generally, photoresists used in the DUV process are chemically-enhanced resists. A variety of chemically-enhanced resists have been developed and are being developed currently. Such chemically-enhanced resists are radiated by DUV rays and then cured in accordance with a baking process carried out after the radiation process, thereby forming desired patterns.

The thermal stability of a baking device, in which a baking process as mentioned above is carried out, serves as an important factor in the fabrication of semiconductor devices. Where the thermal stability of such a baking device is degraded, it is impossible to satisfy a dispersion tolerance in linewidth given for semiconductor devices. This is because the dispersion tolerance in linewidth becomes very small due to a reduction in linewidth to a micro dimension. To this end, most semiconductor manufacturers have made an effort to improve the thermal stability of baking devices. By virtue of such an effort, an improved baking device has been developed in which a heater plate exhibiting a very small temperature dispersion is used as a heating source of the baking device. A baking device including such a heater plate is disclosed in U.S. Pat. No. 4,518,848 issued to Weber.

FIG. 1 schematically illustrates a baking device generally used in the fabrication of semiconductor devices. Such a baking device may be applied to systems manufactured by DNS, Japan bearing trademarks "DNS80A" and "DNS80B" and systems manufactured by TEL, U.S.A. bearing a trademark "MARK". Referring to FIG. 1, the baking device is arranged in the interior of a system housing 308. The baking device comprises a base 300 and a cover 302. A heating plate 304 is mounted on the base 300 to bake a wafer 306 laid thereon. The cover 302 is movable with respect to the base 300 between its open and closed positions. Loading and unloading of the wafer 306 into and out of the baking device are carried out by a robot (not shown). This robot loads the wafer 306 into the baking device and unloads the wafer 306 out of the baking device through a shutter 310 provided on the housing 308.

With such a baking device, however, it is impossible to control a variation in temperature occurring inside of the baking device due to an introduction of ambient cold air into the baking device through the shutter. Such cold air entering the baking device increases a linewidth dispersion beyond the tolerance, as shown in FIG. 2. In FIG. 2, the x-axis indicates the wafer position in the baking device and the y-axis indicates the linewidth dispersion rate of a resist pattern formed on the wafer. FIG. 2 shows that the resist pattern exhibits an instable linewidth dispersion rate at its end portions of the wafer. In order to eliminate such a problem and to maintain a stable linewidth dispersion rate of resist patterns, various proposals as mentioned above have been made. However, conventional methods cannot achieve a stable control over a temperature variation due to ambient air entering the baking device. In particular, the instable linewidth dispersion rate causes more severe problems when resist patterns have a linewidth of 0.25 $\mu$m or less.

SUMMARY OF THE INVENTION

Therefore, an object of the invention is to eliminate the above mentioned problems and to provide an apparatus for baking resists on wafers that is capable of preventing ambient cold air from entering the interior of the baking apparatus.

The present invention also provides an apparatus for baking resists on semiconductor wafers having a base on which a wafer to be baked is laid, a cover arranged to define an interface with the base and separably coupled to the base at the interface, and a controller that controls the internal temperature of the baking apparatus to be equal to the temperature of ambient air surrounding the interface defined between the base and the cover.

The controller may comprise a hot air supply unit that heats air to a desired temperature and supplies the heated air, and a plurality of nozzles connected to the hot air supply unit and arranged around the interface defined between the base and the cover in order to direct the heated air toward the interface. Alternatively, the controller may include a hot air supply unit for heating air to a desired temperature and supplying the heated air, a first nozzle connected to the hot air supply unit and arranged near the interface defined between the base and the cover, the first nozzle serving to direct the heated air supplied from the hot air supply unit onto one surface of the wafer being loaded onto the base or unloaded from the base, and a second nozzle connected to the hot air supply unit and arranged near the interface defined between the base and the cover while opposing vertically the first nozzle, the second nozzle serving to direct the heated air supplied from the hot air supply unit onto the other surface of the wafer.

In accordance with another aspect, the present invention provides an apparatus for baking resists on semiconductor wafers, including a first chamber for heating a wafer to be baked in a sealed condition, a second chamber for cooling the wafer heated in the first chamber, in a sealed condition, a third chamber arranged between the first and second chambers while communicating with the first and second chambers, the third chamber serving to feed the wafer from the first chamber to the second chamber and vice versa and having shutters respectively arranged between the first and third chambers and between the second and third chambers, each of the shutters being able to open and close, and a controller for controlling air existing in the third chamber to be at a desired temperature.

The controller may include a hot air supply unit for heating air to a desired temperature and supplying the heated air into the third chamber, and an air discharge unit for outwardly discharging air existing in the third chamber.

The baking apparatus may further include at least one sub-chamber communicating with the third chamber and having the same configuration as the first chamber, the sub-chamber serving to heat a wafer loaded therein.

In accordance with the baking apparatus of the present invention, it is possible to prevent cold air from entering the interior of the baking apparatus while a baking process is carried out. Accordingly, it is possible to obtain resist patterns exhibiting a uniform linewidth dispersion rate after completing the baking process. Therefore, the productivity of the wafer baking process improved. In particular, a stable linewidth dispersion rate is maintained even when wafers formed with resist patterns having a linewidth of 0.25 μm or less are baked.

BRIEF DESCRIPTION OF THE DRAWINGS

Other objects and aspects of the invention will become apparent from the following description of embodiments with reference to the accompanying drawings in which:

FIGS. 7a to 7c are views respectively illustrating sequential steps of a baking process carried out in the baking apparatus of FIG. 6.

DESCRIPTION OF THE PREFERRED EMBODIMENTS

Figure 1:
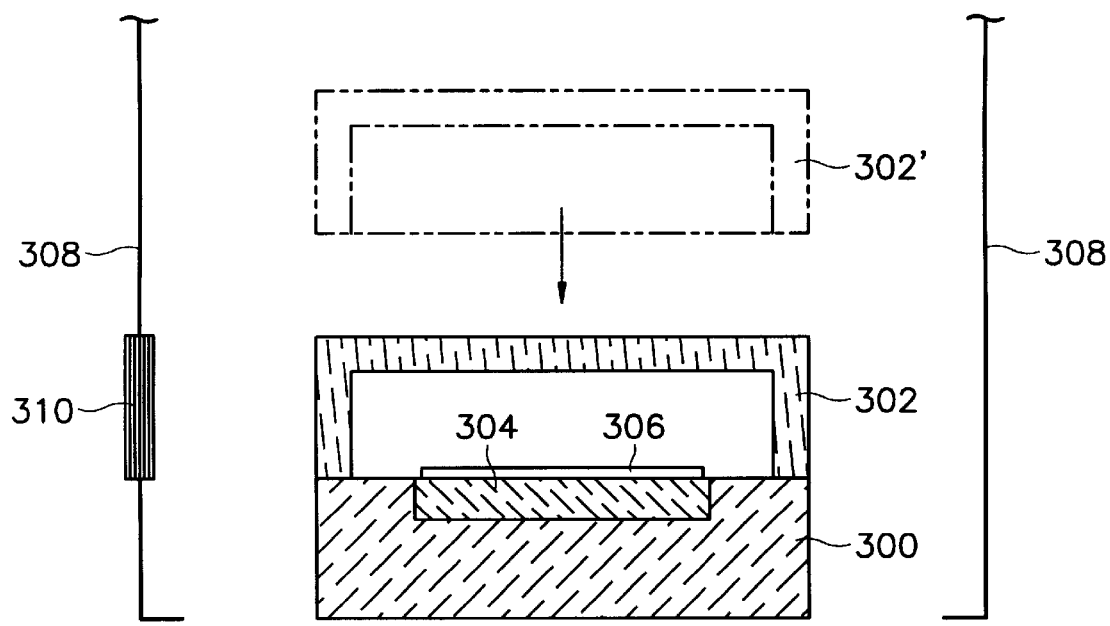
FIG. 1 is a view schematically illustrating a conventional baking apparatus for baking resists on semiconductor wafers.

Referring to FIGS. 3 through 8, various embodiments of the present invention are illustrated. In FIGS. 3 through 8, elements having the same functions are denoted by the same reference numerals, respectively.

Figure 3:
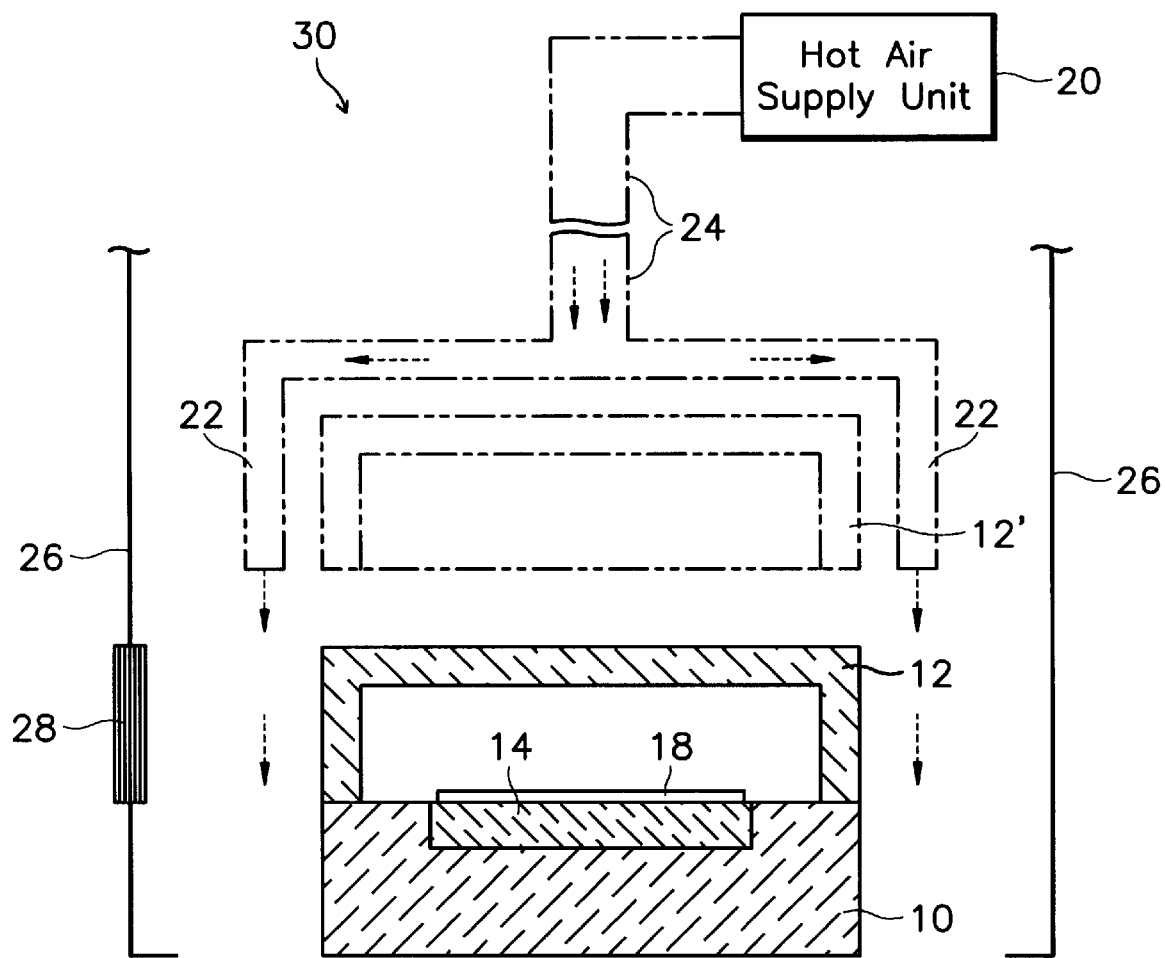
FIG. 3 is a view schematically illustrating an apparatus for baking resists on semiconductor wafers in accordance with a first embodiment of the present invention.

FIG. 3 illustrates an apparatus for baking resists on semiconductor wafers in accordance with a first embodiment of the present invention.

In particular, in accordance with this embodiment, the baking apparatus 30 constitutes one unit of a semiconductor fabrication system in which a photolithography process is carried out. Typically, such a photoresist coating and developing system includes a filtering unit, a spin unit, a feeding unit, and a baking unit. The filtering unit purifies ambient air introduced into the interior of the photoresist coating and developing system. The spin unit coats a resist on a wafer loaded in the photoresist coating and developing system. The feeding unit feeds the resist-coated wafer into the baking unit and takes the baked wafer out of the baking unit. For the feeding unit, various configurations may be employed. For instance, a robot may be used which includes an arm for holding and releasing a wafer. Alternatively, a rail-type feeding unit may be used which enables a continuous feeding of wafers. The baking unit bakes the resist-coated wafer. As mentioned above, the resist is coated on the wafer in the spin unit. The feeding unit moves this resist-coated wafer to the baking unit. The wafer, after baking in the baking unit, is then fed to a cooling plate which, in turn, cools the wafer.

In addition to the above-mentioned units, the photoresist coating and developing system also includes other units having various functions. It will be appreciated by those skilled in the art that the photoresist coating and developing system carries out a variety of processes using the above-mentioned units. It will also be appreciated that the baking apparatus 30 of the present invention is easily applicable to semiconductor fabrication systems of other types.

Referring to FIG. 3 again, the baking apparatus 30 constitutes one unit of the photoresist coating and developing system having the above-mentioned arrangement, as described above. The baking apparatus 30 is arranged in the interior of a housing 26 of the photoresist coating and developing system. A wafer 18 to be baked is loaded into the baking apparatus 30 through a shutter 28 of the housing 26. After baking, the wafer 18 is unloaded from the baking apparatus 30 through the shutter 28. The baking apparatus 30 includes a base 10 with a heating plate 14. The heating plate 14 is mounted on the base 10 and has a structure capable of uniformly heating the entire surface of the wafer 18 which is laid on the heating plate 14. The base 10 includes a heater adapted to heat the heating plate 14, and a chuck (not shown) adapted to hold the wafer 18. The baking apparatus 30 also has a cover 12 that seals the base 10 when closed and opens vertically with respect to the base 10. Accordingly, a separable interface is defined between the base 10 and the cover 12. When the cover 12 is open, the interface is in an open state. In order to prevent ambient air from entering the area in which a baking process is carried out, the baking apparatus 30 further includes a hot air supply unit 20 and nozzles 22. The hot air supply unit 20 generates hot air and supplies the generated hot air to the nozzles 22 via a communication line 24.

The nozzles 22 are arranged around the interface between the base 10 and the cover 12. These nozzles 22 may have a variety of arrangements and positions in accordance with the shape of the interface. The nozzles 22 are appropriately arranged and configured so that they introduce hot air supplied from the hot air supply unit 20 into the interior of the baking apparatus 30 when the cover 12 is open, namely, in the position 12' indicated by the phantom line in FIG. 3. Typically, the internal temperature of the system is maintained at the ambient temperature while the internal temperature of the baking apparatus 30 is typically maintained at 100° C. or higher. Accordingly, as the hot air is injected by the nozzles 22 into the interior of the baking apparatus 30, it is possible to prevent ambient cold air from entering the interior of the baking apparatus 30.

Figure 2:
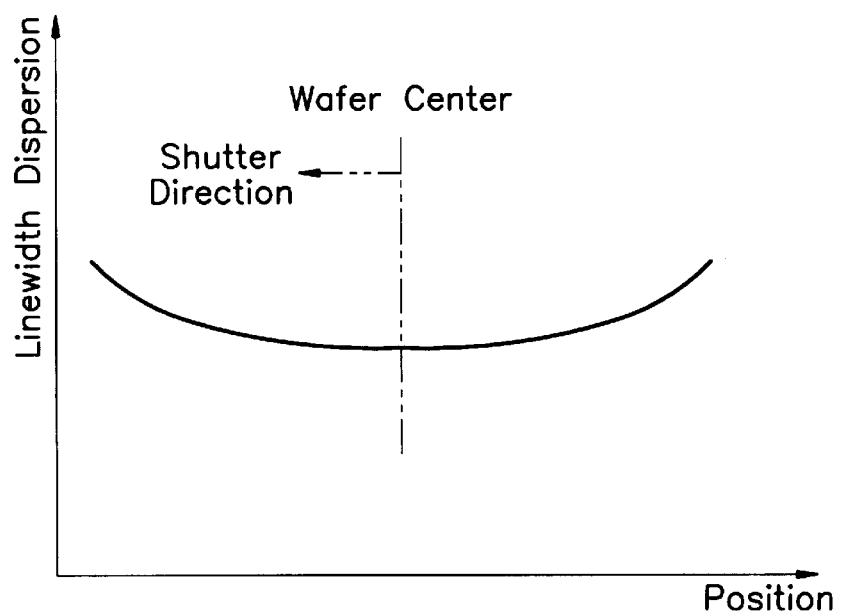
FIG. 2 is a graph depicting a variation in the linewidth dispersion rate of a resist pattern formed on a wafer which has been subjected to a baking process in the baking apparatus of FIG. 1.
Figure 4:
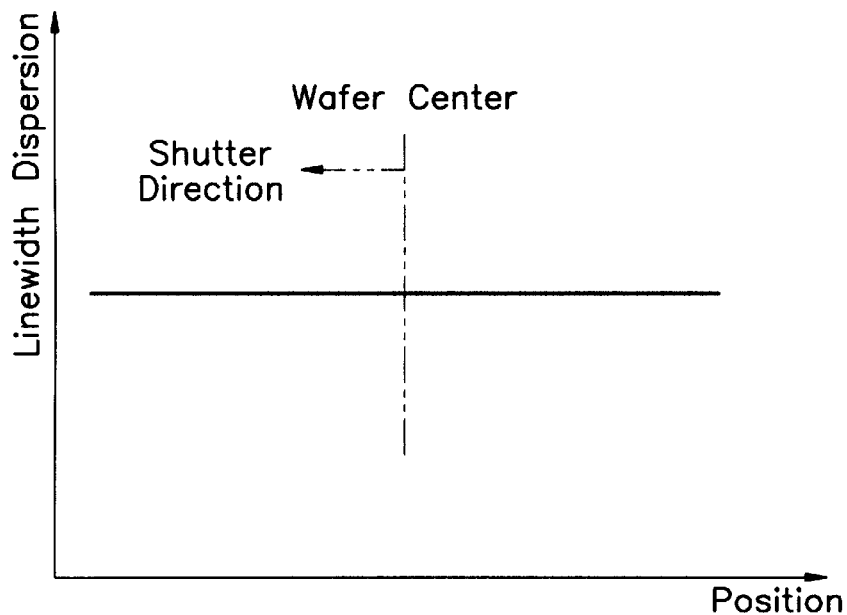
FIG. 4 is a graph depicting a variation in the linewidth dispersion rate of a resist pattern formed on a wafer which has been subjected to a baking process in the baking apparatus of FIG. 3.

FIG. 4 is a graph depicting the linewidth dispersion rate of a resist pattern formed on a wafer which has been subjected to a baking process in the baking apparatus 30 having the above-mentioned configuration. In FIG. 4, the x-axis indicates the wafer position in the baking apparatus and the y-axis the linewidth dispersion rate of the resist pattern formed on the wafer. Compared with the graph of FIG. 2, it is seen that the resist pattern exhibits a stable linewidth dispersion rate even at the ends of the wafer. The baking apparatus of this embodiment does not allow ambient air at a temperature different from the internal temperature of the baking apparatus to enter the baking apparatus during the baking process, thereby maintaining a stable linewidth dispersion rate of resist patterns on wafers.

Figure 5:
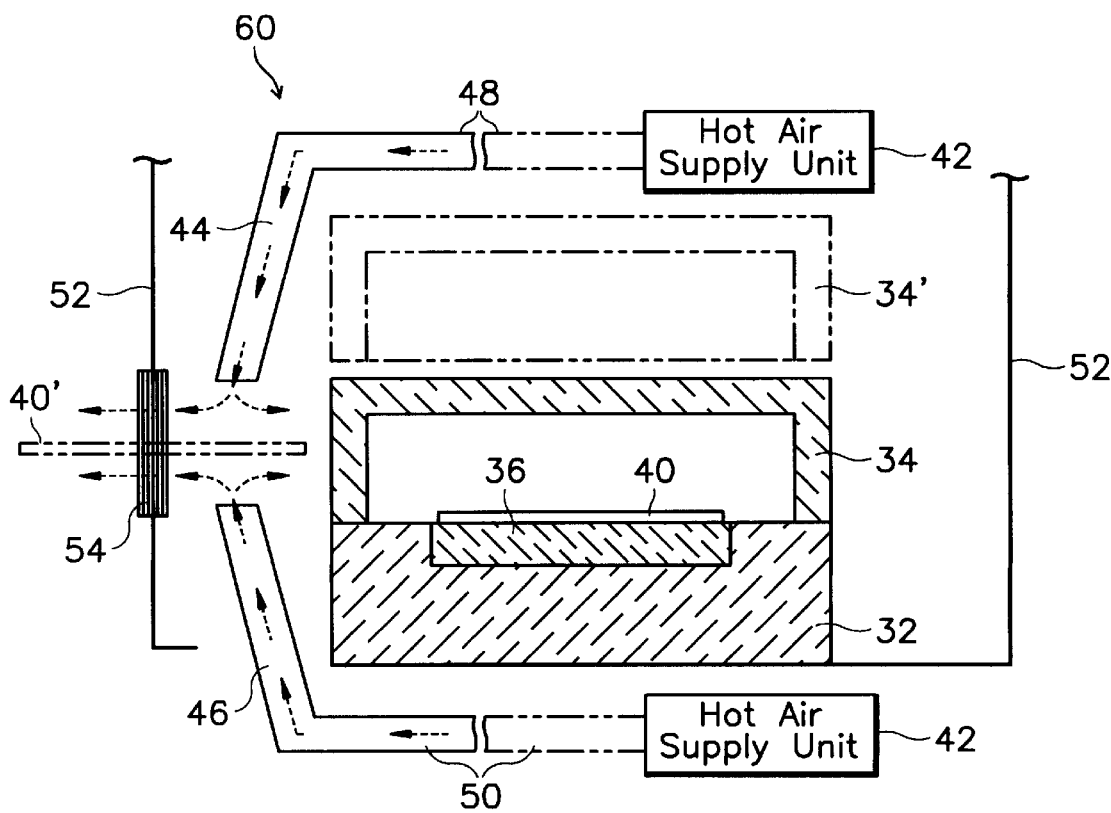
FIG. 5 is a view schematically illustrating an apparatus for baking resists on semiconductor wafers in accordance with a second embodiment of the present invention.

FIG. 5 illustrates a baking apparatus for baking resists on semiconductor wafers in accordance with a second embodiment of the present invention.

As shown in FIG. 5, this baking apparatus, which is denoted by the reference numeral 60, has the same basic configuration as that of the first embodiment of the present invention. That is, the baking apparatus 60 is arranged in the interior of a housing 52 of the photoresist coating and developing system. The baking apparatus 60 includes a base 32 and a cover 34. The cover 34 is arranged on the base 32 in such a manner that a separable interface is defined therebetween. That is, the cover 34 moves vertically with respect to the base 32 to open and close. A wafer 40 to bake is loaded into the baking apparatus 60 through a shutter 54 of the housing 52 by the feeding unit. After baking, the wafer 40 is unloaded out of the baking apparatus 60 through the shutter 54.

The baking apparatus 60, which is disposed in the interior of the system housing 52, is sealed by the system housing 52 at its wall opposite to the shutter 54 through which a wafer 40' is loaded or unloaded. In order to prevent ambient air from entering the baking apparatus 60 when the cover 34 is open, the baking apparatus 60 further includes a hot air supply unit 42 and a pair of nozzles 44 and 46. The first and second nozzles 44 and 46 are arranged in such a manner as to face the upper and lower surfaces of the wafer 40' that pass through the shutter 54, respectively. The first nozzle 44 is connected to the hot air supply unit 42 via a first communication line 48 and injects hot air supplied from the hot air supply unit 42 onto the upper surface of the wafer 40'. The second nozzle 46 is connected to the hot air supply unit 42 via a second communication line 50 and adapted to inject hot air supplied from the hot air supply unit 42 onto the lower surface of the wafer 40'. The baking apparatus 60 of this embodiment can be configured in a simple manner as that of the above-mentioned first embodiment. As mentioned above, the baking apparatus 60 is sealed by the system housing 52 at its wall opposite to the shutter 54 through which the wafer 40' is loaded or unloaded.

Figure 6:
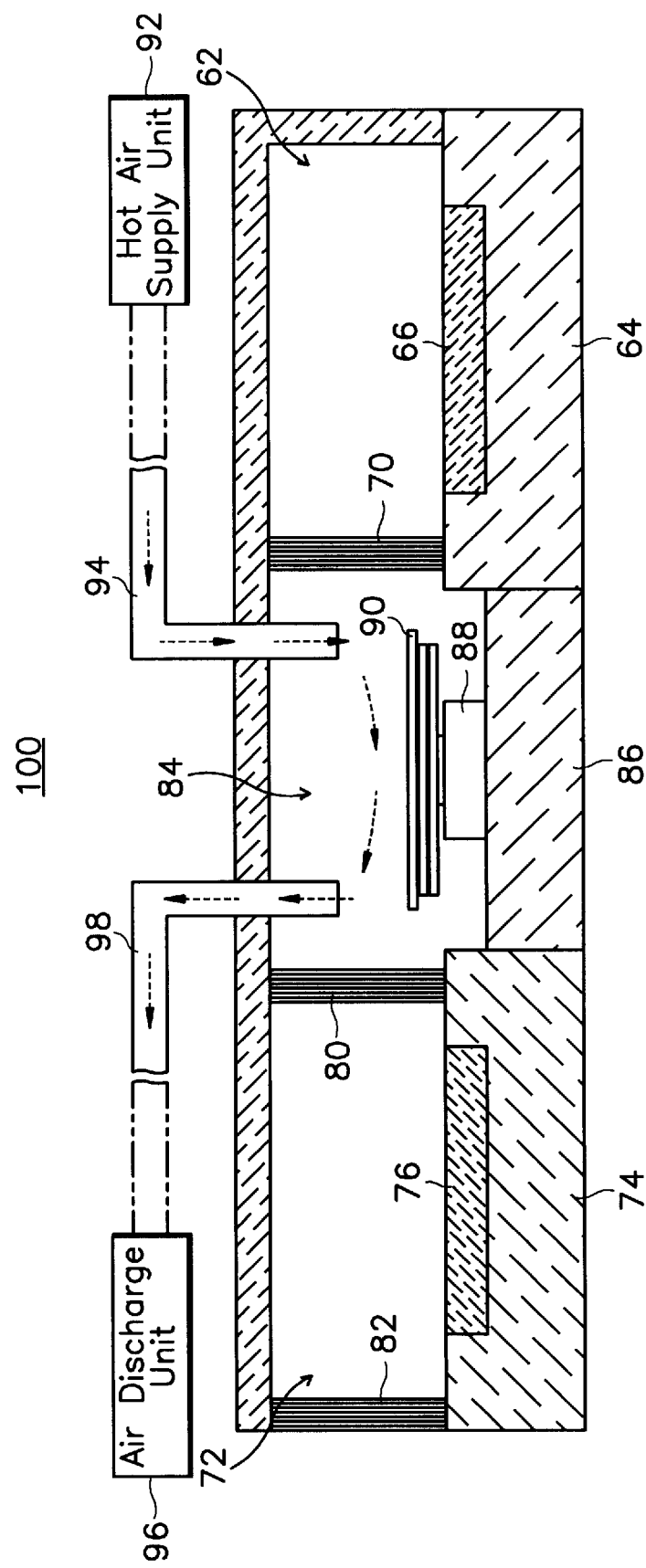
FIG. 6 is a view schematically illustrating an apparatus for baking resists on semiconductor wafers in accordance with a third embodiment of the present invention.

Referring to FIG. 6, a baking apparatus according to a third embodiment of the present invention is illustrated.

As shown in FIG. 6, the baking apparatus, which is denoted by the reference numeral 100, has three chambers 62, 72, and 84. These chambers 62, 72 and 84 are integrally formed together, but the chambers 62, 72 and 84 may be formed separately from one another and then coupled together. The chambers 62, 72 and 84 are adapted to successively handle a wafer for a baking process in a sealed condition. The first chamber 62 heats the wafer in a sealed condition. In this first chamber 62, a heating plate 66 is mounted on a base 64. The second chamber 72 serves to cool the wafer, which has been baked in the first chamber 62, in a sealed condition. In the second chamber 72, a cooling plate 76 is mounted on a base 74. The second chamber 72 receives a wafer, to be loaded into the baking apparatus 100, from the external of the baking apparatus. To this end, the second chamber 72 is provided with a shutter 82 that opens and closes. The third chamber 84 is interposed between the first and second chambers 62 and 72. The third chamber 84 serves to load the wafer 90 into the first chamber 62 while unloading the wafer 90 from the second chamber 72. The wafer loading and unloading are carried out in a sealed condition. To this end, a feeding unit 88 is arranged in the third chamber 84. Shutters 70 and 80 are also arranged between the first and third chambers 62 and 84 and between the second and third chambers 72 and 84, respectively. The third chamber 84 feeds the wafer 90 from the second chamber 72 to the first chamber 62 or vice versa.

In this embodiment, the third chamber 84 prevents ambient air from entering the first chamber 62 when it feeds the wafer 90, to be subjected to a baking process, to the first chamber 62. This is achieved by controlling the internal condition of the third chamber 84 to be the same as the internal condition of the first chamber 62 before the wafer 90 is fed to the first chamber 62. The internal condition of the third chamber 84 is controlled by a hot air supply unit 92 and an air discharge unit 96 both communicating with the third chamber 84. The hot air supply unit 92 generates hot air and injects the generated hot air into the interior of the third chamber 84 via an air supply line 94. On the other hand, the air discharge unit 96 serves to outwardly discharge air from the third chamber 84 via an air discharge line 98.

Figure 7B:
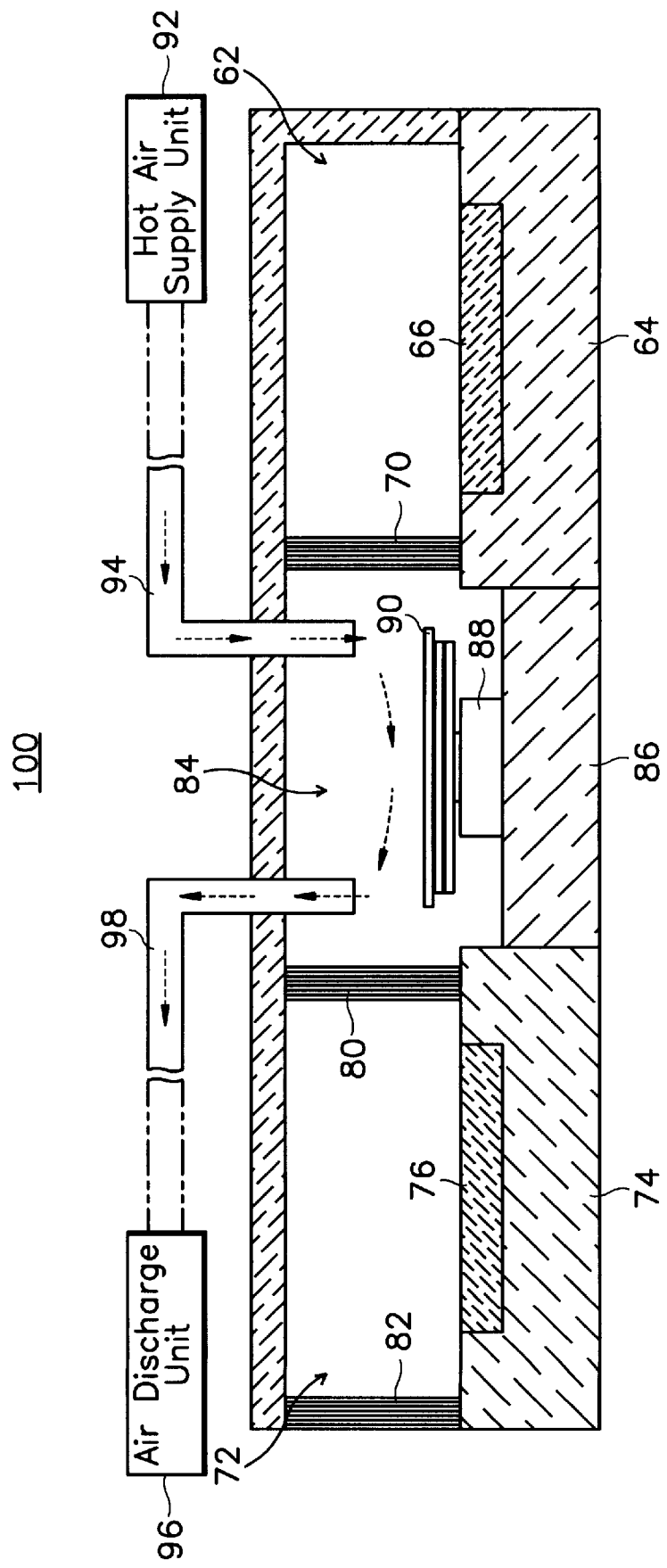

FIGS. 7A to 7C are views respectively illustrating sequential steps of a baking process carried out in the baking apparatus of FIG. 6.

Referring to FIGS. 7A to 7C, a wafer 90 to bake is first fed from the outside of the baking apparatus to the second chamber 72 of the baking apparatus 100. The wafer 90 is then loaded onto the cooling plate 76 of the second chamber 72 through the shutter 82 by an external feeding unit (not shown). When the shutter 80 arranged between the second and third chambers 72 and 84 is open, the wafer 90 is fed to the third chamber 84 by the feeding unit 88 arranged in the third chamber 84 (FIG. 7A). Subsequently, the shutter 80 is closed. In this state, hot air from the hot air supply unit 92 is supplied into the third chamber 84 via the air supply line 94. The hot air introduced in the third chamber 84 is then outwardly discharged from the third chamber 84 via the air discharge line 98 by the air discharge unit 96. This procedure is continued until the internal condition such as, temperature, of the third chamber 84 is in equilibrium with the internal condition of the first chamber 62 (FIG. 7B). The determination and comparison of the internal conditions of the first and third chambers 62 and 84 are appreciated by those skilled in the art. For instance, this may be achieved by arranging sensors in the first and third chambers 62 and 84 to measure respective inner conditions of those chambers, and comparing data respectively detected by the sensors with each other by using a controller (not shown). This controller may be a controller included in the system to which the baking apparatus is applied. Alternatively, the controller may be a separate controller. When the internal condition of the third chamber 84 is in equilibrium with the internal condition of the first chamber 62, the shutter 70 arranged between the first and third chambers 62 and 84 is opened. In this state, the wafer 90 is loaded onto the heating plate 66 in the first chamber 62 by the feeding unit 88. After the loading of the wafer 90 onto the heating plate 66, the shutter 70 is closed. In this state, a baking process is carried out in the first chamber 62. When the baking process is completed, operations reverse to the above-mentioned operations are carried out, so that the wafer completing its baking is cooled by the cooling plate 76 in the second chamber 72 and then outwardly fed.

In the baking apparatus 100 according to the third embodiment of the present invention, the loading and unloading of the wafer is carried out in a sealed condition. Accordingly, it is possible to avoid degradation in the linewidth dispersion rate of resist patterns caused by an introduction of ambient air at a temperature different from the internal temperature of the baking apparatus.

Figure 8:
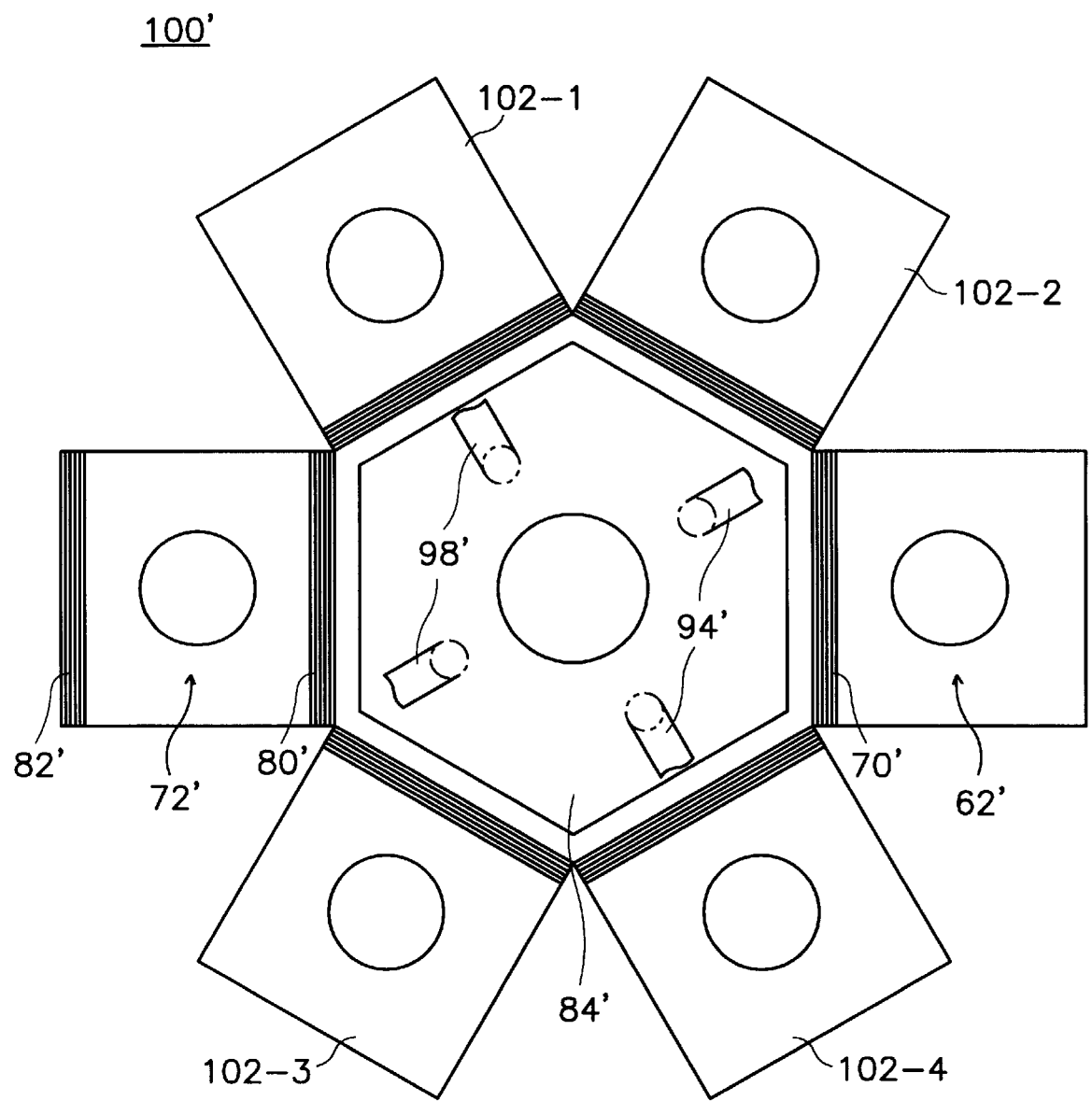
FIG. 8 is a plan view schematically illustrating a baking apparatus having a configuration modified from the baking apparatus of FIG. 6.

The baking apparatus of the third embodiment may be modified to have a configuration including a plurality of baking chambers 62', 102-1, 102-2, 102-3, and 102-4, as shown in FIG. 8. In this case, the baking apparatus, which is denoted by the reference numeral 100' in FIG. 8, includes a central chamber 84' having a polygonal structure. The baking chambers 62', 102-1, 102-2, 102-3, and 102-4 are arranged around the central chamber 84'. In this case, the central chamber 84' serves as a main chamber having the same function as the third chamber 84 of the baking apparatus 100 according to the third embodiment of the present invention whereas the chambers 62', 102-1, 102-2, 102-3, and 102-4 serve as sub-chambers having the same function as the first chamber 62 of the baking apparatus 100. A shutter 70' is arranged between the main chamber 84' and each of the sub chambers 62', 102-1, 102-2, 102-3, and 102-4. The baking apparatus 100' also includes a sub chamber 72' having the same function as the second chamber 72 of the baking apparatus 100. That is, the sub chamber 72' for loading a wafer from the external of the baking apparatus 100' into the baking apparatus 100' and unloading the wafer from the baking apparatus 100'. The sub chamber 72' is provided with shutters 80' and 82' respectively arranged between the sub chamber 72' and the main chamber 84' and between the sub chamber 72' and the external of the baking apparatus 100'. Appropriate numbers of air supply lines 94' and air discharge lines 98' may be connected to the main chamber 84'. This baking apparatus 100' according to an embodiment modified from the third embodiment of the present invention is advantageous because an increased number of wafers that can be simultaneously baked enhances productivity. The baking operation of the baking apparatus 100' is carried out in the same manner as that of the baking apparatus 100 according to the third embodiment of the present invention, except that a plurality of wafers are loaded or unloaded with respect to the baking chambers 62', 102-1, 102-2, 102-3, and 102-4, respectively. Accordingly, no description is made here of the baking operation.

As apparent from the above description, the present invention provides an apparatus for baking resists on semiconductor wafers, which prevents cold air from entering the interior of the baking apparatus while a baking process is carried out. In accordance with the baking apparatus of the present invention, accordingly, it is possible to obtain resist patterns exhibiting a uniform linewidth dispersion rate after completing the baking process. Therefore, the productivity of the wafer baking process is improved. In particular, a stable linewidth dispersion rate is achieved even when wafers formed with resist patterns having a linewidth of 0.25 $\mu$m or less are baked.

Although the preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. An apparatus for baking a semiconductor wafer with an upper face and a lower face, comprising:
   a base upon which a wafer to be baked may be positioned;
   a cover separably coupled to the base along an interface and defining a heating chamber; and
   a heating unit wherein said heating unit limits variation of temperature between air in the heating chamber and ambient air along the interface.

2. An apparatus as recited in claim 1, wherein said heating unit comprises:
   a hot air supply unit; and
   a plurality of nozzles in fluid connection with said hot air supply unit.

3. An apparatus as recited in claim 2, wherein said plurality of nozzles are positioned such that hot air from said hot air supply unit is injectable through said nozzles towards the interface between said cover and said base.

4. An apparatus as recited in claim 1, further comprising:
   an openable shutter mechanism through which the wafer may be loaded into and unloaded from the apparatus, and
   wherein said heating unit comprises:
   a first hot air supply unit;
   a second hot air supply unit;
   a first nozzle in fluid connection with said first hot air supply unit;
   a second nozzle in fluid connection with said second hot air supply unit;
   wherein hot air from said first hot air supply is injectable through said first nozzle and hot air from said second hot air supply is injectable through said second nozzle and further wherein said first nozzle is positioned to inject air toward the upper face of the wafer and said second nozzle is positioned to inject air towards the lower face of the wafer.

5. An apparatus as recited in claim 4, wherein said first hot air supply unit and said second hot air supply unit are combined.

6. A semiconductor baking apparatus, comprising:
   a first chamber for heating a semiconductor wafer;
   a second chamber for cooling a wafer heated in said first chamber;
   a third chamber positioned between said first chamber and said second chamber;
   an openable first shutter positioned between said first chamber and said third chamber allowing the semiconductor wafer to move between said first chamber and said third chamber when opened;
   an openable second shutter positioned between said second chamber and said third chamber allowing the wafer to move between said second chamber and said first chamber when opened;
   an openable third shutter positioned between said second chamber and outside of the semiconductor baking apparatus; and
   a heating unit that controls air temperature of said third chamber.

7. A semiconductor baking apparatus as recited in claim 6, wherein said heating unit comprises:
   a hot air supply unit in fluid connection with said third chamber.

8. A semiconductor baking apparatus as recited in claim 7, wherein said heating unit further comprises:
   a hot air discharge unit in fluid connection with said third chamber for outwardly discharging air from said third chamber.

9. A semiconductor baking apparatus as recited in claim 7, further comprising:
   a temperature sensor positioned in said first chamber for measuring air temperature in said first chamber;
   a temperature sensor positioned in said third chamber for measuring air temperature in said third chamber; and
   a controller for comparing the first chamber air temperature to the third chamber air temperature and adjusting the hot air supply based on difference therebetween.

10. A semiconductor baking apparatus, comprising:
    a feeder chamber;

a cooling chamber with a first shutter openable for loading wafers into and unloading wafers from the semiconductor baking apparatus and a second shutter openable for movement of wafers between said cooling chamber and said feeder chamber;

a plurality of baking chamber disposed about said feeder chamber, each said baking chamber having an openable baking chamber shutter for movement of wafers between one of said baking chamber and said feeder chamber; and a heating unit that controls temperature in said feeder chamber.

11. An apparatus for baking a semiconductor wafer with an upper face and a lower face, comprising:

a base upon which a wafer to be baked may be positioned;

a cover separably coupled to the base along an interface and defining a heating chamber; and a means for limiting variation of temperature between air in the heating chamber and ambient air along the interface.

12. A semiconductor baking apparatus, comprising:

a first chamber for heating a semiconductor wafer;

a second chamber for cooling a wafer heated in said first chamber;

a third chamber positioned between said first chamber and said second chamber;

an openable first shutter positioned between said first chamber and said third chamber allowing the semiconductor wafer to move between said first chamber and said third chamber when opened;

an openable second shutter positioned between said second chamber and said third chamber allowing the semiconductor wafer to move between said second chamber and said first chamber when opened;

an openable third shutter positioned between said second chamber and outside of the semiconductor baking apparatus; and a means for controlling air temperature of said third chamber.

13. A semiconductor baking apparatus, comprising:

a feeder chamber;

a cooling chamber with a first shutter openable for loading wafers into and unloading wafers from the semiconductor baking apparatus and a second shutter openable for movement of wafers between said cooling chamber and said feeder chamber;

a plurality of baking chambers disposed about said feeder chamber, each said baking chamber having an openable baking chamber shutter for movement of wafers between one of said baking chamber and said feeder chamber; and a means for controlling temperature in said feeder chamber.

* * * * *